US005264783A

United States Patent [19]

Vig et al.

[11] Patent Number: 5,264,783

[45] Date of Patent: Nov. 23, 1993

[54] CONTACTLESS MAGNET-ACTIVATED PROPORTIONAL CONTROLLER

[75] Inventors: Ravi Vig, Concord, N.H.; Mark C. Hopkins, Hillsborough, N.C.; Jay M. Towne, Henniker, N.H.

[73] Assignee: Allegro Microsystems, Inc., Worcester, Mass.

[21] Appl. No.: 823,094

[22] Filed: Jan. 21, 1992

[51] Int. Cl.⁵ ........................ G05F 1/635; H03K 17/90

[52] U.S. Cl. .................................... 423/294; 323/368; 307/309; 324/117 H; 338/32 H

[58] Field of Search ........................ 323/294, 368, 351; 307/309; 324/117 H; 338/32 H

[56] References Cited

U.S. PATENT DOCUMENTS

| | | | |
|---|---|---|---|
| 4,296,410 | 10/1981 | Higgs et al. | 340/686 |
| 4,443,716 | 4/1984 | Avery | 307/309 |
| 4,638,870 | 1/1987 | Kousek | 173/12 |
| 4,908,527 | 3/1990 | Van Antwerp | 307/309 |
| 4,992,731 | 2/1991 | Lorenzen | 324/174 |
| 5,045,920 | 9/1991 | Vig et al. | 357/74 |
| 5,162,987 | 11/1992 | Sambhu | 364/162 |
| 5,166,548 | 11/1992 | Nelson | 307/309 |

*Primary Examiner*—Emanuel T. Voeltz
*Assistant Examiner*—Adolf Berhane

[57] ABSTRACT

An electrical power controller includes an integrated circuit having a Hall element, a Hall voltage amplifier, a ramp signal generator, and a voltage comparator. The output of the ramp generator is connected to one input of the voltage comparator and the output of the Hall voltage amplifier is connected to the outer comparator input. During intervals when the amplified Hall voltage exceeds the ramp voltage, the output of the comparator changes from one binary state to the other such that a stream of pulses is generated at the output of the comparator. Thus as a magnetic field at the Hall element increases, the Hall voltage increases and the width of each pulse in the stream of pulses grows proportionally. Mechanical means is provided for manually moving and guiding the pole of a magnet along a path toward the integrated circuit. Constructions of such controllers adapted for use as lamp dimmers and DC motor speed controllers are described.

4 Claims, 4 Drawing Sheets

FIG. 6
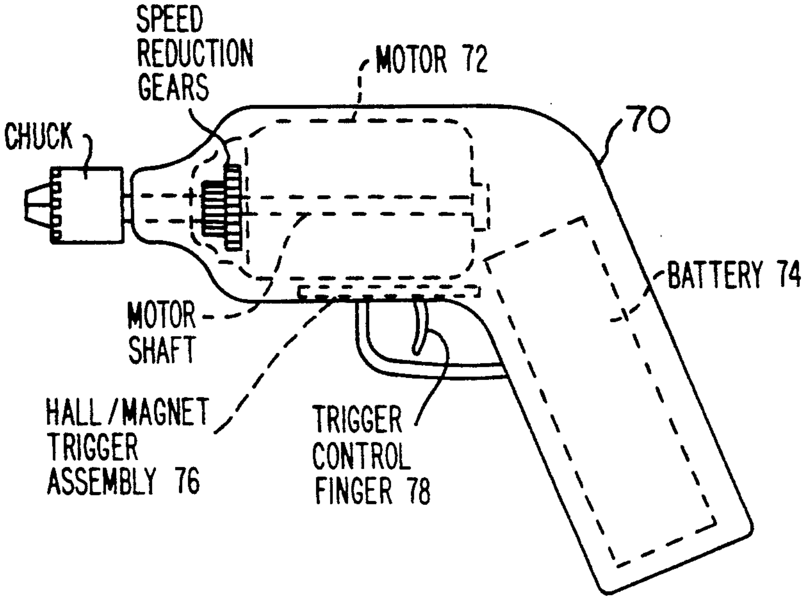
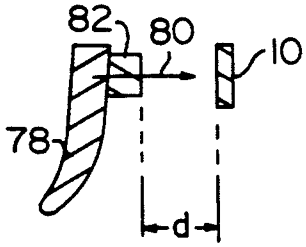
FIG. 7
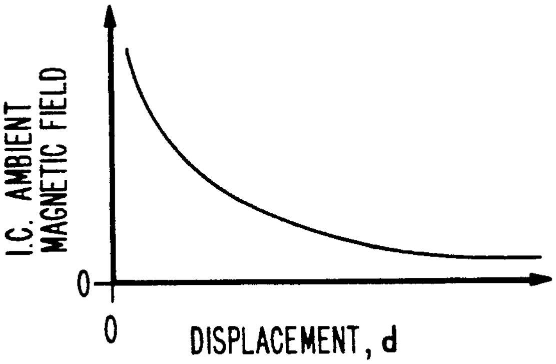
FIG. 8

FIG. 9
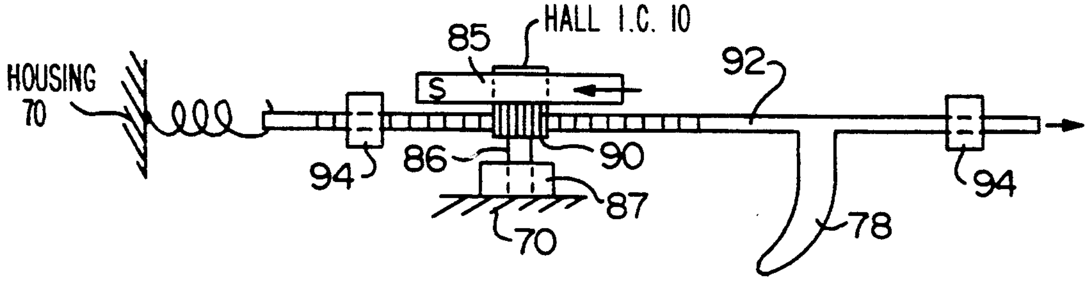
FIG. 10
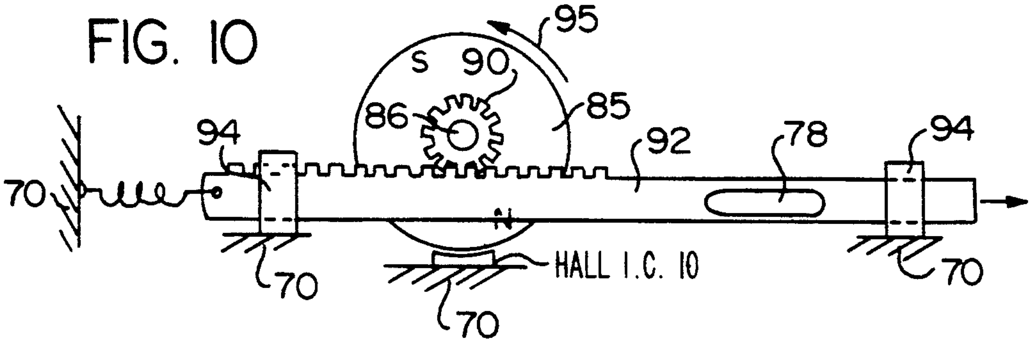
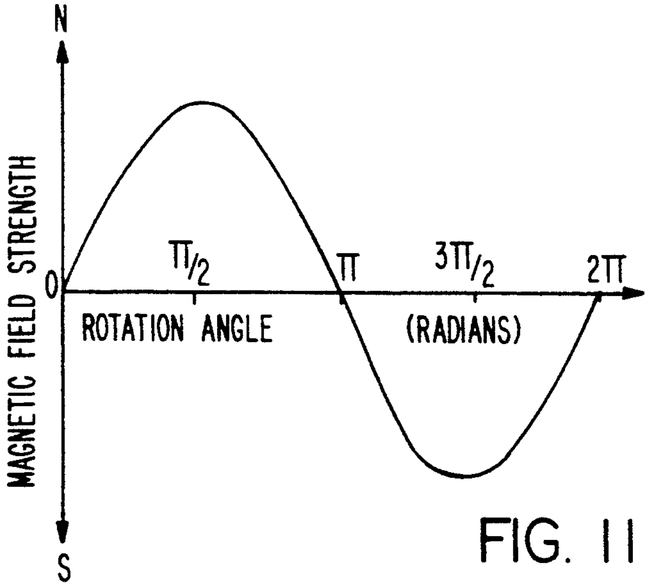
FIG. 11

CONTACTLESS MAGNET-ACTIVATED PROPORTIONAL CONTROLLER

BACKGROUND OF THE INVENTION

This invention relates to mechanical-to-electrical transducers and more particularly relates to a contactless magnet-activated electrical-power "proportional" controller.

A variety of mechanical to electrical "proportional" controllers are known. As used herein, the term "proportional" means continuous but not necessarily linear.

Lamp dimmers that operate from an AC voltage source have become a well known commodity. They employ three-leaded controlled rectifiers in combination with manually operable potentiometers. Motor speed controllers also use controlled rectifiers, or amplifiers, in association with manually operable potentiometers. It is also known to make controllers for being powered by a DC voltage source usually including a DC powered amplifier.

Magnet activated circuits such as the ferrous article proximity sensors are described in U.S. Pat. Nos. 4,296,410 to Higgs; 4,443,716 to Avery and 5,045,920 to Vig et al, all of which are assigned to the same assignee as is the present invention. Each of these circuits includes a Hall element and Schmitt trigger circuit having an input that is connected to the output of the Schmitt trigger circuit so when the ambient magnet field exceeds a value at which the corresponding voltage exceeds the threshold voltage of the Schmitt trigger circuit, the output of the Schmitt trigger circuit changes from one binary state to the other. These circuits are switching controllers and not proportional controllers.

It is an object of the present invention to provide a proportional controller for generating an average output voltage that is proportional to the strength of an ambient magnetic field.

It is a further object of this invention to provide such a controller including a magnet that is movably mounted adjacent the controller circuit for altering the ambient magnetic field.

It is yet a further object of this invention to provide such a controller circuit in the form of an integrated circuit which is particularly well suited for operation from a source of low DC voltage.

BRIEF DESCRIPTION OF THE DRAWINGS

FIG. 6 shows in side sectional view a battery powered hand drill including a proportional speed controller of this invention.

FIG. 7 shows the relative juxtaposition of the key components of the trigger assembly of FIG. 5, namely the trigger finger, magnet and integrated circuit.

FIG. 8 shows a plot of the ambient magnetic field at the integrated circuit as a function of the displacement between the integrated circuit and the magnet.

FIG. 9 shows in side view the relative juxtaposition of the key components of another trigger assembly suitable for use in the hand-drill of FIG. 5, wherein a ring magnet is rotated by the integrated circuit package via a rack and pinion by squeezing the trigger finger.

FIG. 10 shows in bottom view the another trigger assembly of FIG. 9.

FIG. 11 shows a plot of the ambient magnetic field at the integrated circuit as a function of the degree of rotation of the ring magnet in the trigger assembly of FIGS. 9 and 10.

SUMMARY OF THE INVENTION

An electrical power controller includes a Hall element, a Hall voltage amplifier, a ramp signal generator, and a voltage comparator. The ramp signal voltage is connected to one input of the comparator and the amplified Hall amplifier voltage is connected to the other input of the comparator. When in the comparator the difference between the ramp signal voltage and the amplified Hall voltage exceeds zero, or another predetermined voltage, the output of the comparator changes from one binary state to the other and a stream of pulses is generated at the output of the comparator. Thus a magnetic field at the Hall element increases, the Hall voltage increases and the width of each pulse in the stream of pulses grows proportionally; this leads to an increase in the average voltage at the output of the comparator.

A magnet guidance control means is provided for movably mounting the magnet in the housing adjacent the Hall element, and for guiding a pole end of the magnet toward and away from the Hall element when the magnet is manually moved. This effects a change in the ambient magnetic field at the Hall element and the amplitude of the amplified Hall voltage applied to the input of the modulator, so that the duty factor of the stream of output pulses is a function of the magnetic spacing between the magnet pole end and the Hall element.

A power transistor is preferably included, the output of the comparator being connected to the control element of the power transistor, so that the power delivered to an electrical load through the power transistor is a function of the displacement between the magnet and the Hall element.

The electrical load may consist of a lamp or DC motor, and especially a load that is suitable for being emergized from a DC voltage source preferably less than 20 volts so as to be appropriately employed in vehicles or portable tools in which battery power is available. The controller circuit of this invention may readily be provided in silicon integrated circuit form, except for the magnet and the load, leading to small size and low cost. Thus it is well suited to use in automotive applications such as dashboard lamp-dimmers and windshield wiper controls.

The contactless controller of this invention also offers the potential for exceptionally long life and reliability compared to prior art controllers employing wipe-arm potentiometers or simply mechanically contacting switches serving as the mechanical to electrical transducers.

DESCRIPTION OF THE PREFERRED EMBODIMENTS

Figure 1:
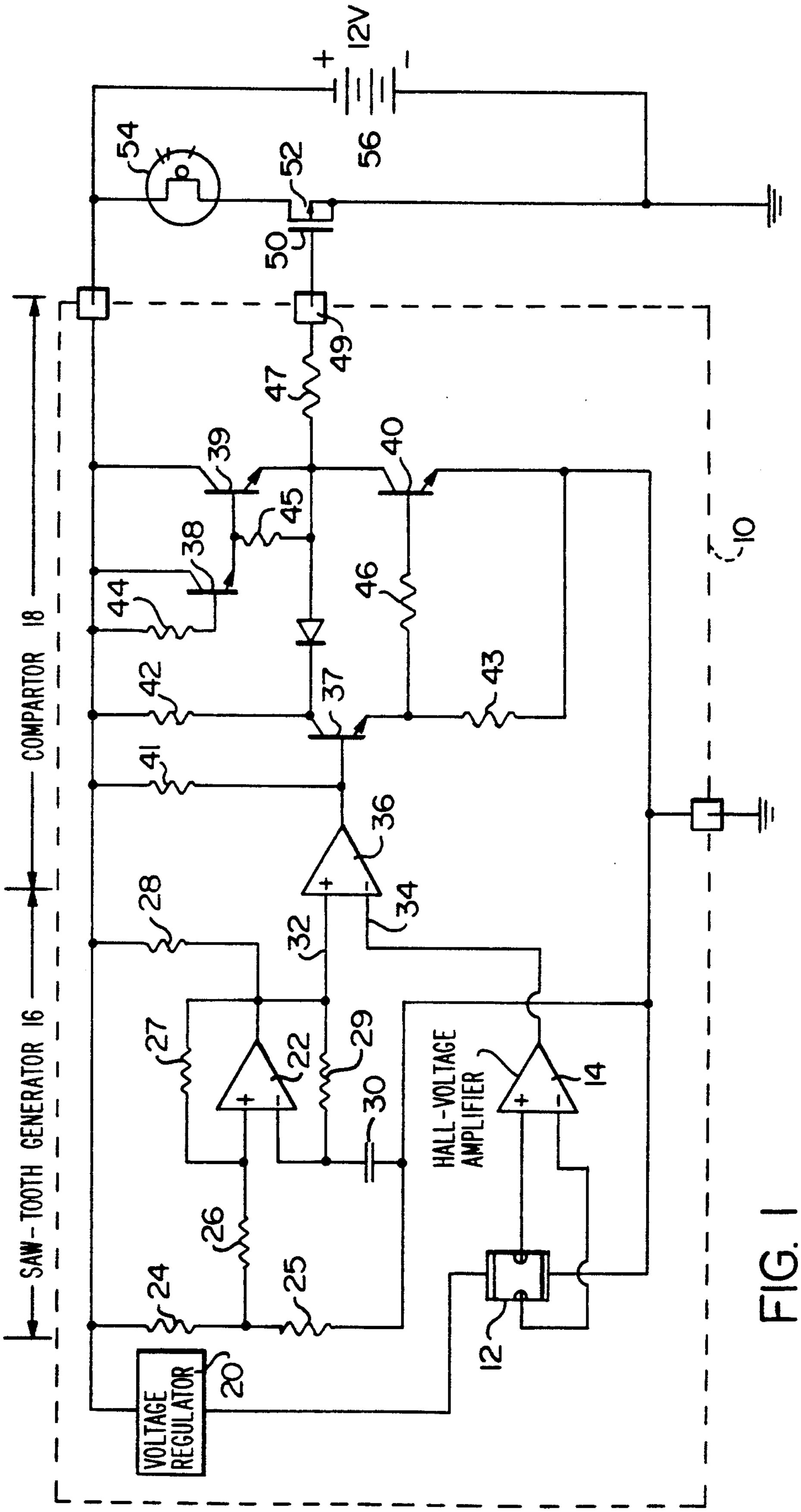
FIG. 1 shows a circuit diagram of an integrated circuit controller of this invention.

The controller of FIG. 1 is formed in an integrated circuit 10 that includes a Hall element 12, a Hall-voltage amplifier 14, a saw-tooth generator 16, a comparator 18 and a DC voltage regulator 20. The saw-tooth generator 16 is composed of amplifier 22, 24, 25, 26, 27, 28 and 29, and capacitor 30. The output of the saw-tooth generator 16 is connected to one input 32 of the comparator 18, and the output of the Hall-voltage amplifier 14 is connected to the other input 34 of the comparator 18.

The comparator 18 includes a standard voltage comparator 36 producing a binary output voltage that is in one state when the difference between the amplified Hall voltage and the ramp voltage is less than a fixed predetermined threshold voltage, which threshold voltage in this embodiment is essentially zero volts. That binary output voltge is in the other state when the difference of the input voltages is greater than the predetermined threshold voltage, i.e. zero volts. Comparator 18 further includes a binary voltage amplifier comprised of transistors 37, 38, 39 and 40, and resistors 41, 42, 43, 44, 45, 46 and 47. The output of the comparator 18 is connected via a contact pad 49 to the control element 50, namely the gate, of the NMOS power transistor 52. Transistor 52 is connected in series with a load, namely the lamp 54, that is in turn connected to the DC voltage supply, namely the battery 56.

Figure 2:
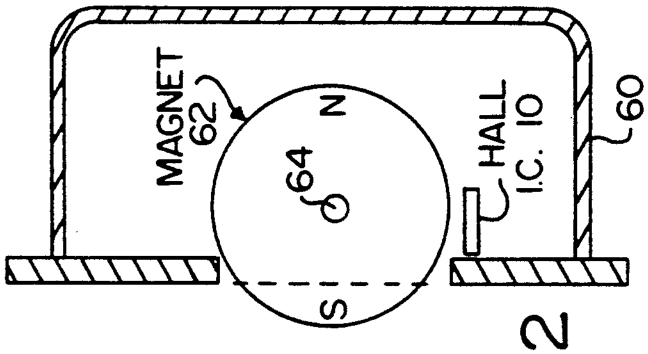
FIG. 2 shows a wall mountable thumb-wheel magnet and integrated circuit controller assembly, wherein the integrated circuit may be that of FIG. 1.

The controller assembly of FIG. 2 consists of a housing 60 configured for flush mounting in the surface of a building (not shown). A ring magnet, or thumb wheel magnet 62 is mounted in the housing 60 by a spindle 64 so that the ring magnet 62 is manually rotatable about the spindle 64. As shown in FIG. 2, the poles of the magnet 62 are about equally distant from the Hall integrated circuit 10 in which position the magnetic field strength at the Hall element 12 is essentially nil.

Figure 3:
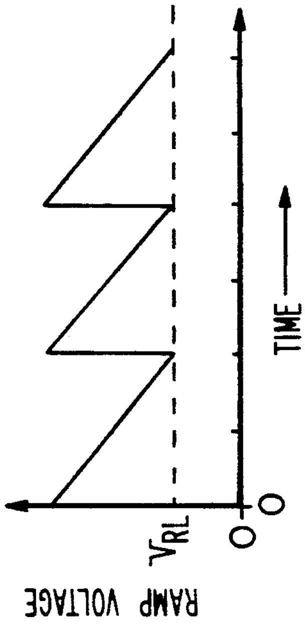
FIG. 3 shows a saw-tooth waveform at the input of the comparator in the controller of FIG. 1 with no ambient magnetic field.

In this magnet position, the amplified Hall voltage appearing at comparator input 34 is also essentilly zero and the saw-tooth voltage at comparator 32 is the entire comparator input voltage appearing across the two inputs 32 and 34 is simply the saw-tooth generator voltage as illustrated in the waveform of FIG. 3.

Since as seen in FIG. 3, the input voltage at comparator input 34 is zero, or near zero, and the lowest points in the ramp voltage signal, $V_{RL}$, is above zero volts, the comparator output voltage will be in the low (zero) state. Using this ramp voltage having a minimum voltage that is offset a fixed amount, $V_{RL}$, from zero volts, the magnetic field ambient at the integrated circuit must exceed the field strength corresponding to an amplified Hall voltage that exceeds $V_{RL}$ before the output of the comparator 18 changes to the high state and turn on transistor 52 and lamp 54.

This assurance that the lamp be completely off even if a small non-zero ambient field exists, may be accomplished in another manner. For example, if $V_{RL}$ were to be zero, a Schmitt trigger circuit (not shown) with differential input and a built-in threshold voltage may be substituted in place of the basic comparator 36.

Figure 4:
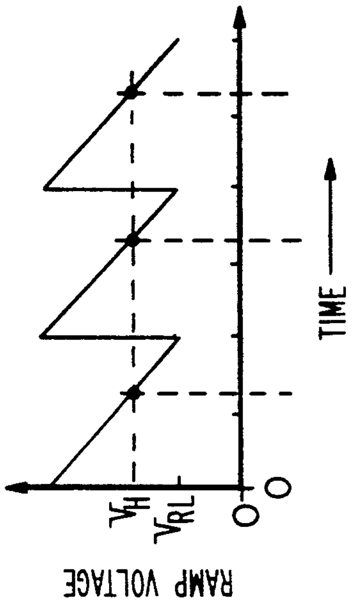
FIG. 4 shows a waveform of the combination of a Hall voltage and the saw-tooth waveform of FIG. 3, at the input of the comparator in the controller of FIG. 1, with an ambient magnetic field.
Figure 5:
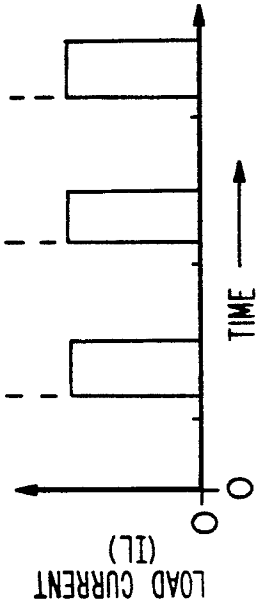
FIG. 5 shows a waveform of the output load (lamp) current corresponding to the waveforms of FIGS. 3 and 4. The time scales in FIGS. 3, 4 and 5 are the same.

When the thumb wheel magnet 62 is turned counter clockwise about 45 degrees moving the south pole closer to the Hall integrated circuit 10, an amplified Hall voltage $V_H$ is generated as is illustrated in the waveform of FIG. 4, and during a later interval in each period of the saw-tooth voltage, the amplified Hall voltage exceeds the saw-tooth voltage. During each such interval, the output voltage of the comparator is in a high level binary state turning on the power transistor 52. Also during this high level state the load current $I_L$ flows through the lamp, as is illustrated in the waveform of FIG. 5.

In general as the thumb wheel magnet 62 is turned to cause the south pole of the magnet to approach the Hall integrated circuit 10, the pulse width of each pulse at the output of the comparator increases in a continuous manner and the average comparator output voltage increases. Since the power transistor 52 is on only when held on by a comparator voltage pulse, the average lamp current $I_L$ is also a continuous function of the displacement between a magnet pole, the south magnet pole in this embodiment, and the Hall element 12.

The battery operated pistol-grip hand drill of FIG. 6 has a housing 70 enclosing a DC motor 72, a battery 74 and a Hall-magnet trigger assembly 76. The trigger finger 78 may be pivotally connected to the housing, or may alternatively be slidably connected in a groove of the housing (not shown) to restrict its movement to linear motion in the direction of the arrow in FIG. 7. A magnet 82 is fixedly mounted to the trigger finger, and the Hall integrated circuit 10 is fixedly mounted to the housing 70 and spaced away from but adjacent to and facing a pole end of the magnet 82.

When the trigger finger 78 is squeezed moving the magnet 82 toward the Hall element 12 in the integrated circuit 10, the magnetic field strength at the Hall element increases, slowly at first and more rapidly as the magnet 82 approaches the Hall element 12 at a steady rate. This non-linear proportional relationship is illustrated by the plot of FIG. 8 of field strength versus displacement, d, between magnet and integrated circuit. The simple mechanical assembly of FIG. 7 advantageously provides most precise finger control of drill speed at low speeds where it is needed most.

An alternative Hall-magnet trigger assembly for use as assembly 76 in the hand drill of FIG. 6 is illustrates in FIGS. 9 and 10. The Hall integrated circuit is fixedly mounted to the drill housing 70 and a ring magnet 85 has an axle 86 mounted by a bearing 87 to the drill housing so the outer perimeter of the magnet 85 is always adjacent to but spaced away from the Hall integrated circuit 10. A pinion gear 90 is coaxially mounted to the ring magnet 85. A rack gear 92 is constrained to move linearly by guide blocks 94 to always engage the pinion gear 90. The trigger finger 78 is connected to the rack gear 92.

When the trigger finger 78 is pulled by the drill operator, the magnet 85 rotates as indicated by arrow 95 in FIG. 10 bringing the south pole of the magnet closer to the Hall integrated circuit 10. This corresponds to a region in the magnetic field plot of FIG. 11 within the angular range of $\pi/2$ to $3\pi/2$. In the middle of this range a fairly linear relationship exists between the distance through which the trigger is pulled and the speed of the motor. It will be appreciated that a great variety of motor speed to trigger displacement relationships can be had by employing different geometries in the construction of the Hall-magnet trigger assembly, while using the same Hall integrated circuit controller.

What is claimed is:

1. A battery powered contactless controller comprising:

a) a housing;

b) a pulse-width modulator means having a modulator input, and having a modulator output;

c) a Hall element fixedly mounted in said housing and having an output connected to said modulator input, said pulse width modulator means being for producing at said modulator output a stream of pulses having a duty factor that is a function of the amplitude of a Hall voltage applied to said modulator input;

d) a battery mounted in said housing and connected to said modulator means and to said Hall element for supplying the operating energy thereto;

e) a Hall-magnet trigger assembly including a magnet and a magnet mounting and guiding means for mounting said magnet in said housing for rendering a pole end of said magnet manually movable and mechanically guided with respect to said Hall element, for rendering the amplitude of Hall voltage applied to said modulator input a function of the magnetic field at said Hall element and thus a function of the displacement of said magnet pole end of said manually movable magnet with respect to said Hall element, and for rendering the duty factor of the stream of pulses at said output terminal a continuous function of that displacement of said manually movable magnet;

e) a transistor having a control element connected to said modulator output for turning on said transistor during each of the pulses, and for turning off said transistor in the absence of the pulses; and f) a DC load connected between said transistor and said battery so that the average DC current through said DC load is a specific continuous function of the manually effected displacement between said magnet pole end and said Hall element, which specific continuous function is directly related to the particular geometry of said Hall-magnet trigger assembly including the shape of the magnet.

2. The contactless controller of claim 1 wherein said housing is the housing of a vehicle.

3. The contactless controller of claim 1 wherein said housing is the housing of a hand tool.

4. The contactless controller of claim 1 wherein said load is a DC motor.

* * * * *